US012614013B2

(12) United States Patent
Su et al.

(10) Patent No.: US 12,614,013 B2
(45) Date of Patent: Apr. 28, 2026

(54) SLACK BUDGETING AND DISCRETIZATION FOR A PROGRAMMABLE DEVICE

(71) Applicant: Synopsys, Inc., Mountain View, CA (US)

(72) Inventors: Yu-Hsuan Su, Hsinchu City (TW); Li-En Hsu, Hsinchu City (TW); Chuan-Chia Huang, Hsinchu City (TW); Chien-Hung Chen, Kaohsiung City (TW); Chia-Chi Huang, Cupertino, CA (US); Selma Bergaoui Ben Jrad, Montbonnot-Saint-Martin (FR)

(73) Assignee: Synopsys, Inc., Sunnyvale, CA (US)

( * ) Notice: Subject to any disclaimer, the term of this patent is extended or adjusted under 35 U.S.C. 154(b) by 759 days.

(21) Appl. No.: 18/080,594

(22) Filed: Dec. 13, 2022

(65) Prior Publication Data

US 2023/0186006 A1    Jun. 15, 2023

Related U.S. Application Data

(60) Provisional application No. 63/289,611, filed on Dec. 14, 2021.

(51) Int. Cl.
*G06F 30/347* (2020.01)
(52) U.S. Cl.
CPC .................................. *G06F 30/347* (2020.01)
(58) Field of Classification Search
CPC ...................................................... G06F 30/347

USPC ........................................................ 716/117
See application file for complete search history.

(56) References Cited

U.S. PATENT DOCUMENTS

| | | | | |
|---|---|---|---|---|
| 7,275,233 B2 * | 9/2007 | McElvain | ............. | G06F 30/323 |
| | | | | 716/108 |
| 7,290,232 B1 * | 10/2007 | Fung | ................... | G06F 30/3312 |
| | | | | 716/121 |
| 7,853,911 B1 * | 12/2010 | Fung | ....................... | G06F 30/34 |
| | | | | 716/113 |
| 10,534,878 B1 * | 1/2020 | Bai | ..................... | G06F 30/3312 |
| 11,755,810 B2 * | 9/2023 | Betz | ..................... | G06F 30/394 |
| | | | | 716/131 |
| 2003/0149954 A1 * | 8/2003 | McElvain | ............. | G06F 30/327 |
| | | | | 716/103 |

(Continued)

*Primary Examiner* — Suchin Parihar
(74) *Attorney, Agent, or Firm* — Patterson + Sheridan, LLP

(57) ABSTRACT

A method includes receiving a physical circuit design file that includes physical circuit partitions that are each mapped to a respective chip. The physical circuit partitions are connected to one another by a respective timing path having an original delay. The method further includes determining a slack budget of the respective timing path, and determining a delay upper bound value based on a shortest timing path delay and the slack budget. Further, the method includes updating the delay upper bound of the respective timing path based on the slack budget, assigning an interconnection delay upper bound to a physical interconnection between at least two chips based on the updated slack budget of the respective timing path, determining a multiplexing data ratio (XDR) based on at least the interconnection delay upper bound of the physical interconnection, and performing routing between the at least two chips based on the XDR.

20 Claims, 15 Drawing Sheets

1200

1202 Wire delay upper bound

1204 Directly convert delay upper bound to XDR as initial solution

1206 Determine upper and lower bound of binary search

1208 Find minimum delay upper bound violation by binary search

1226 Calculate delay and convert to XDR

1228 Wire XDR (TDM ratio)

Start

1210 Ub= max. delay upper bound violation
Lb= min. delay upper bound violation

1212 $DV(i) = (Ub + Lb) / 2$

1214 Is $|Ub - Lb| \geq K$ ? / 1216 Exit / No

Yes

1218 Calculate XDR according to DV(i)

1220 Is pin pair capacity enough? No / Yes

1222 Ub = DV(i)  1224 Lb = DV(i)

(56) References Cited

U.S. PATENT DOCUMENTS

| | | | | |
|---|---|---|---|---|
| 2008/0250371 A1* | 10/2008 | Uchino | ............... | G06F 30/3312 |
| | | | | 716/113 |
| 2014/0068536 A1* | 3/2014 | Oda | .................... | G06F 30/3315 |
| | | | | 716/113 |
| 2015/0347655 A1* | 12/2015 | Grinshpon | ............ | G06F 30/337 |
| | | | | 716/134 |
| 2016/0042115 A1* | 2/2016 | Segal | .................... | G06F 30/398 |
| | | | | 716/136 |
| 2016/0210396 A1* | 7/2016 | Gentry | ................ | G06F 30/3312 |
| 2016/0344645 A1* | 11/2016 | Zhang | .................... | H04L 12/28 |
| 2021/0073453 A1* | 3/2021 | Betz | ...................... | G06F 30/394 |

* cited by examiner

100

Receive RTL design file — 102

Generate a unified front end — 104

Synthesis to gates — 106

Partition to modules and units — 108

Module-level physical design — 110

System-level routing and socket and debug logic generation — 112

Generate an FPGA physical design — 114

Emulation ready — 116

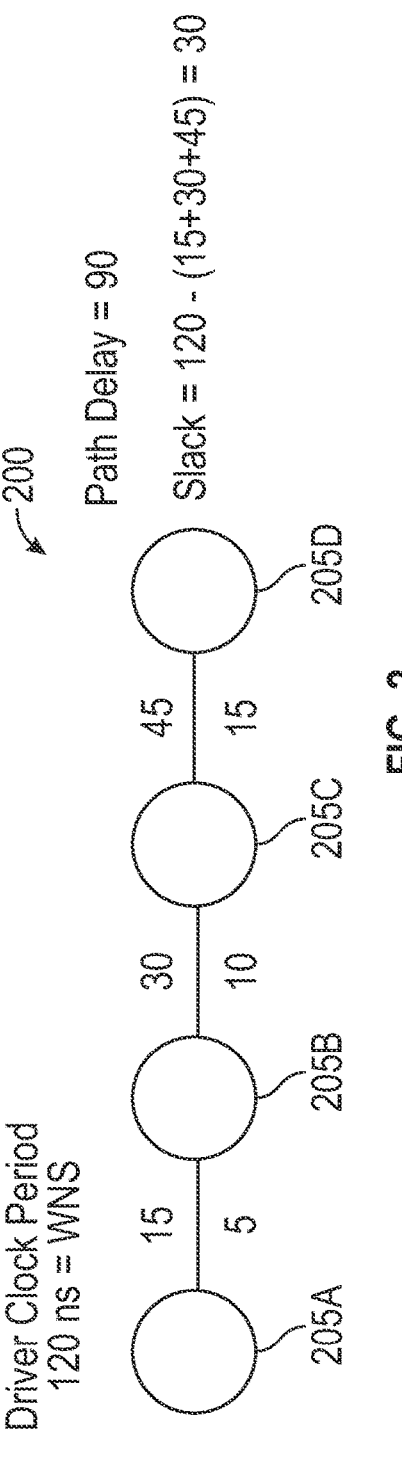

Driver Clock Period
120 ns = WNS

Path Delay = 90

Slack = 120 - (15+30+45) = 30

Convergence Conditions [1]

(a) $f(arc, \pi) > 0$, for every arc (b) $\Sigma_{arc:arc \in \pi} f(arc, \pi) \leq 1$, for every path $\pi$ $$slack\_budget(arc) = \underset{paths \ \pi:arc \ \in \ \pi}{min} \left[ \frac{delay(arc)}{delay(\pi)} * slack(\pi) \right] = \underset{paths \ \pi:arc \ \in \ \pi}{min} \left[ f(arc,\pi) * slack(\pi) \right]$$

$$f(arc,\pi) = \frac{delay(arc)}{delay(\pi)} > 0$$

$$\frac{delay(arc)}{\Sigma_{arc:arc \in \pi} \ delay(\pi)} = 1 \leq 1$$

FIG. 3

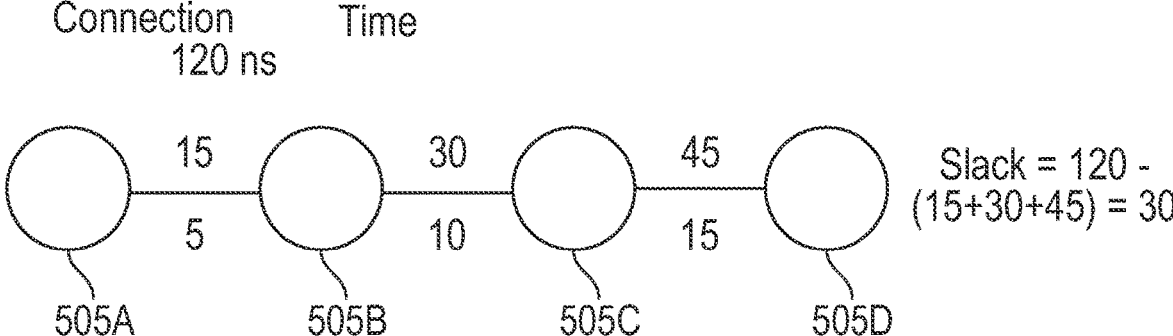
$$slack\_budget(arc) = \min_{paths\ \pi:arc\ \epsilon\ \pi} \left[ \frac{delay(arc)}{delay(\pi)} * slack(\pi) \right]$$
$$upper\_bound(arc) = delay(arc) + slack\_budget(arc)$$
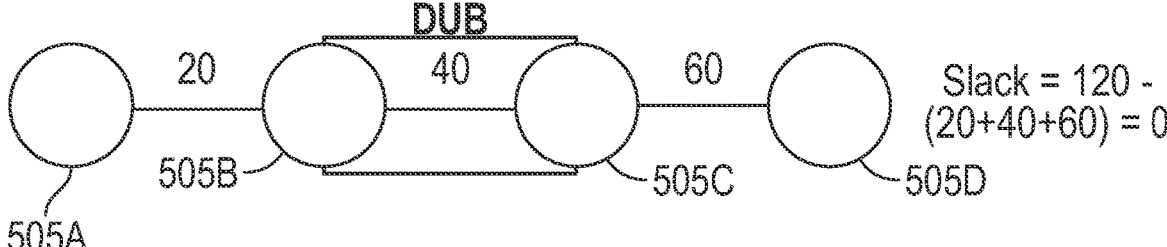
FIG. 5

610
Original Arc
Delay:         30 ns          140 ns          30 ns

605D 605A          605B          605C

615
Shortest Path
Delay:          20 ns          20 ns          20 ns

620
Original Slack
Budget:        -15 ns         -70 ns         -15 ns

625
Original DUB:   15 ns          70 ns          15 ns

630
Updated DUB:    20 ns          60 ns          20 ns

635
Updated Slack
Budget:        -10 ns         -80 ns         -10 ns

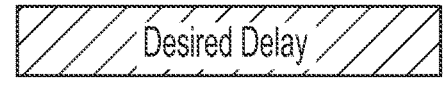
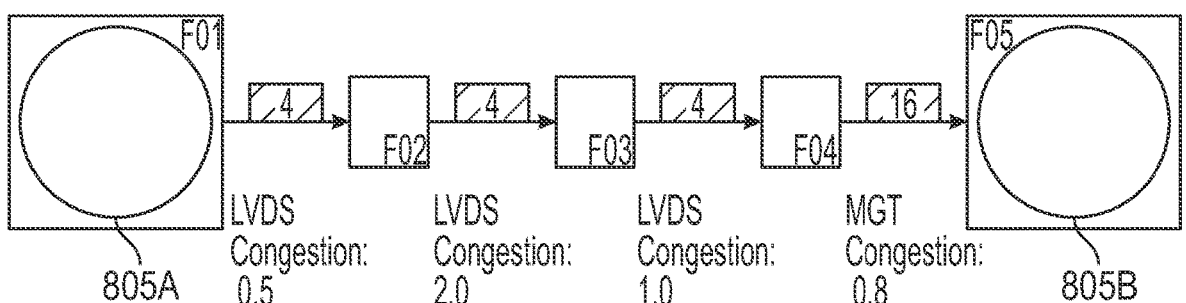
FIG. 8A
Remaining Budgets: 68 - 28 = 40 ns
$$40 \times (0.5/(0.5 + 2.0 + 1.0 + 0.8)) = 4.7$$
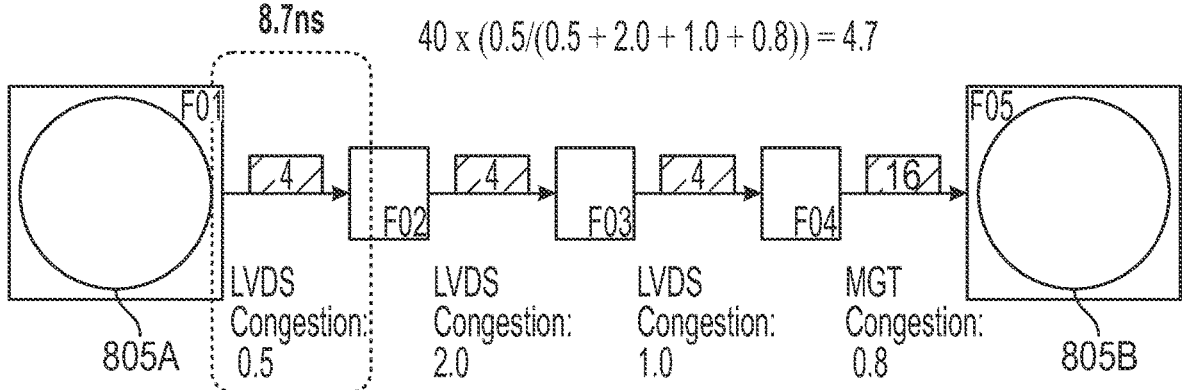
FIG. 8B

Assume Integer is the Legal XDR and XDR/Delay Ratio = 1

$$(4 + 4.7) \rightarrow XDR = 9 \text{ (roundup)}$$

Assume XDR:Delay = 1

XDR = 9 → XDR = 7

6ns $XDR = 7 \rightarrow XDR = 6$

F01

4 4 4 16

F02      F03      F04

805A

LVDS          LVDS          LVDS          MGT
Congestion:   Congestion:   Congestion:   Congestion:
0.5           2.0           1.0           0.8

F05

805B

6ns $6 \sim 4 \rightarrow 2$

F01

2
4          4          4          16

F02      F03      F04

805A

LVDS          LVDS          LVDS          MGT
Congestion:   Congestion:   Congestion:   Congestion:
0.5           2.0           1.0           0.8

F05

805B

SLACK BUDGETING AND DISCRETIZATION FOR A PROGRAMMABLE DEVICE

RELATED APPLICATION

This application claims the benefit of U.S. Provisional Patent Application Ser. No. 63/289,611 filed on Dec. 14, 2021, which is incorporated herein by reference.

TECHNICAL FIELD

The present disclosure generally relates to a circuit design emulation and prototyping system. In particular, the present disclosure relates to slack budgeting and discretization for a programmable device.

BACKGROUND

Field programmable gate array (FPGA) and other programmable devices are emulated (or prototyped) to verify the functionality of the devices. Digital circuit designs are represented as register transfer language (RTL) designs and emulation systems implement the RTL design on various FPGAs by partitioning the RTL design into partitions that each fits into one FPGA.

After matching each partition with an FPGA, inter-FPGA signals are used to communicate between the various FPGAs. The number of inter-FPGA signals may be greater than the number of FPGA input/output (I/O) pins and the number of physical connections (e.g., pin-pairs) between the FPGAs. Time-multiplexing (TMX) is used to send multiple inter-FPGA signals through the same physical connection. The TMX process utilizes a fast emulation clock signal. The delay of the TMX process is linearly proportional to the number of inter-FPGA signals on the same TMX connection. This number is called the multiplexing data ratio (XDR) of the TMX connection. The larger the XDR, the larger the delay of the TMX process on the corresponding TMX connection. Accordingly, the delay of a timing path of the RTL design implemented on multiple FPGAs is dominated by the delay of the TMX connections which is greater than the delay of the combinational logic on the timing path.

SUMMARY

In one example, a method of the present disclosure comprises receiving a physical circuit design file that includes physical circuit partitions that are each mapped to at least one of a first chip, second chip, and a third chip, wherein the first chip and second chip are connected by a first timing path, the second chip and third chip are connected by a second timing path, and the first timing path and the second timing path each have a desired delay; determining a total slack budget based on a driver clock period and a sum of the desired delay for the first timing path and the desired delay for the second timing path; proportioning the total slack budget to the first timing path and the second timing path based at least in part on the desired delay for each of the first timing path and the second timing path; and adjusting a routing of electronic signals along the first timing path and the second timing path, based on the proportioned slack budget.

In another example, a system of the present disclosure comprises a memory storing instructions; and a processor coupled with the memory, the processor configured to execute the instructions to cause the processor to: receive a physical circuit design file that includes physical circuit partitions that are each mapped to at least one of a first chip, second chip, and a third chip, wherein the first chip and second chip are connected by a first timing path, the second chip and third chip are connected by a second timing path, and the first timing path and the second timing path each have an original path delay; determine a proportioned slack budget for each of the first timing path and the second timing path; determine, for each of the first timing path and the second timing path, a delay upper bound based on the original path delay and the slack budget of each timing path; update the delay upper bound of the each timing path based on a shortest timing path delay; assign a multiplexing data ratio (XDR) value to the proportioned slack budget for each of the first timing path and the second timing path; adjust the XDR value based on reuse of existing wires in at least one of the first timing path and second timing path; determine an updated proportioned slack budget for each of the first timing path and the second timing path, based at least in part on the adjusted XDR value and the desired delay for each of the first timing path and second timing path; and adjusting a routing of electronic signals along the first timing path and the second timing path, based on the proportioned slack budget.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2 illustrates example arcs and delays, according to an embodiment of the disclosure.

FIG. 3 illustrates example process for determining arc delay, according to an embodiment of the disclosure.

FIG. 5 illustrates example arcs and an example process for determining a slack budget, according to an embodiment of the disclosure.

FIG. 8A illustrates example chip to chip connections and a portion of a process for assigning a slack budget for the chip to chip connections, according to an embodiment of the disclosure.

FIG. 8B illustrates example chip to chip connections and a portion of a process for assigning a slack budget for the chip to chip connections, according to an embodiment of the disclosure.

DETAILED DESCRIPTION

Figure 1:
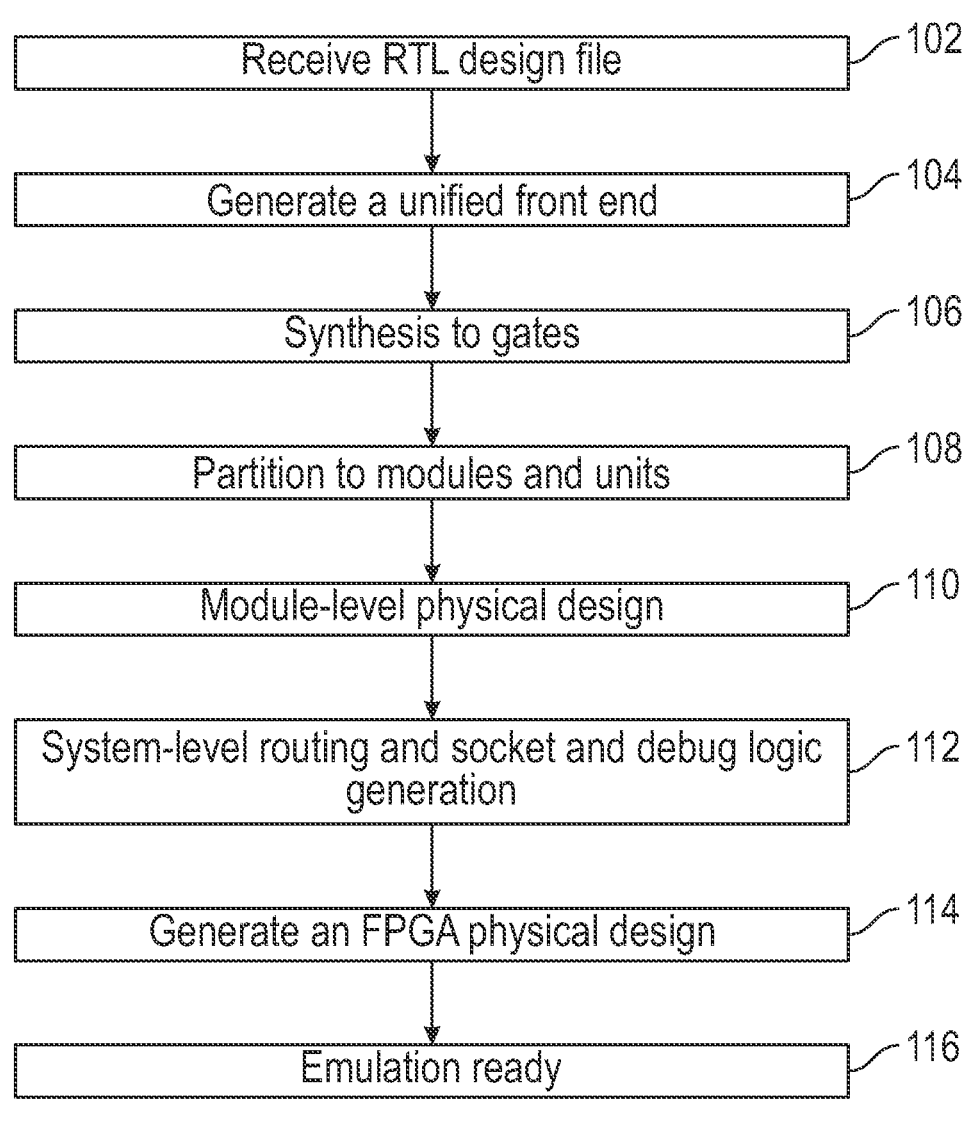
FIG. 1 illustrates a flowchart for preparing a circuit design for emulation, according to an embodiment of the disclosure.

Aspects of the present disclosure relate to slack budgeting and discretization for a programmable device.

Emulation (e.g., prototyping) is used to verify the functionality of a circuit design. Field programmable gate array (FPGA) and other programmable devices are emulated (or prototyped) to verify the functionality of the devices. The emulation process uses a register transfer language (RTL) representation of a circuit design. During the emulation process, the RTL design is divided in various partitions, which are assigned to different FPGAs. As multiple FPGAs are used to emulate a circuit design, inter-FPGA connections are used to communicate between the FPGAs.

The number of inter-FPGA connections is limited based on the available number of input/output pins of an FPGA and connections between FPGAs (e.g., pin-pairs). Time-multiplexing (TMX) is used to increase the number of inter-FPGA signals that can be communicated between FPGA devices. TMX allows for multiple signals to be communicated over the same inter-FPGA connection using a time sharing approach. TMX is used to send multiple inter-FPGA signals through the same physical connection. However, TMX has a delay corresponding to the multiplexing data ratio (XDR) that dominates the delay of the circuit design.

In an RTL design in which all inter-FPGA signals have been placed into FPGAs, the timing-driven routing problem is to route the RTL design to mitigate delay. In the present disclosure, routing within an RTL design is performed based on a slack budgeting process that approximates a desired route delay, pattern routing, and discretization. Accordingly, the routing process routes the RTL design while mitigating the delay. The slack budgeting and pattern routing efficiently guides the routing process to approximate the optimal solution with the binary-search-based discretization. Accordingly, the worst negative slack (WNS) and total negative slack (TNS) are mitigated without negatively affecting the compile time of the RTL design, improving the efficiency of the corresponding emulation process.

In the following, an FPGA-based system-level routing framework employing slack budgeting and discretization is described. The described routing framework improves emulation (prototyping) performance as compared to other routing methods. In one or more examples, the following framework uses slack budgeting for inter-FPGA routing. Further, the desired delay is used to guide the routing process. The desired delay defines the target delay of each trace (e.g., wire). In one or more examples, the following routing processes utilizes discretization. XDR assignment and routing demand calculation enlarges the routing solution space. Further, pattern routing is used for improved convergence and detour decisions. In pattern routing, routing paths are pre-computed so that there is no need to do the maze routing or A* search during the routing algorithm. In one or more examples, the present binary search based discretizer is used to determine wire XDR.

Technical advantages of the present disclosure include, but are not limited to, the use of slack budgeting for inter-FPGA routing. With the use of slack budgeting, the negative slack is mitigated without negatively affecting the compile time of the RTL, improving the efficiency of the corresponding emulation process. Further, with the present disclosure, a desired delay is used to guide the inter-FPGA routing process. In addition, with the present disclosure, discretization is used in the inter-FPGA routing process. The solution space for routing is also enlarged by XDR assignment and routing demand calculations. Moreover, use of a binary search based discretizer to determine wire XDR is more efficient and effective than previously used methods.

FIG. 1 illustrates a flowchart of a method 100 for performing placement and routing for inter-FPGA connections. The method 100 is performed by one or more processors (e.g., the processing device 1502 of FIG. 15) executing instructions (e.g., instructions 1526 of FIG. 15) stored in a memory device (e.g., the main memory 1504 or the machine-readable medium 1524 of FIG. 15). While discrete steps are presented in exemplary FIG. 1, there may be fewer or additional steps present in method 100 in various embodiments.

The method 100 includes receiving an RTL design file at 102. At 104, a unified front end is generated from the RTL design file. In one example, the unified front end is a command setting for a compiler protocol. At 106, the RTL design file is synthesized to gates. At 108, the RTL design file is partitioned into modules and units, and at 110, a module-level physical design is generated. System-level routing and socket and debug logic generation of the RTL design file is performed at 112. FIGS. 2-12 describe aspects of the system-level routing and socket and debug generation in more detail. An FPGA physical design is generated at 114, and emulation is performed on the FPGA physical design at 116.

As is noted above, in one or examples, inter-FPGA nets may exceed the number of FPGA I/O pins. Accordingly, time division multiplexing (TDM) is used to route multiple inter-FPGA nets through the same FPGA pin. XDR is the number of inter-FPGA nets divided by the number of FPGA pins. The router process is timing driven and performs discretization of the RTL design. The following improved routing and discretization process improves routing performance at 112 by mitigating both WNS and TNS without negatively affecting the compile time strength.

In one or more examples, the following router process uses a desired delay and slack budgeting to guide the routing process. The desired delay is used as the required time. The desired delay is defined as the minimum delay routing. If all connections are the same, the minimum delay will be the shortest path delay with TDM. If there are several connection types, it is the minimum delay for all combinations of the longest timing path.

FIG. 2 illustrates an example slack budget computation process 200. The slack budget computation process 200 may be performed by one or more processors (e.g., the processing device 1502 of FIG. 15) executing instructions (e.g., instructions 1526 of FIG. 15) stored in a memory device (e.g., the main memory 1504 or the machine-readable medium 1524 of FIG. 15). Further, the slack budget computation process may be performed by a compiler (e.g., the compiler 1410 of FIG. 14) as part of an emulation process.

In the example of FIG. 2, nodes 205A, 205B, 205C, and 205D correspond to different FPGA chips. The clock driver period is defined as 120 ns (e.g., WNS). The path delay is 90 nanoseconds (ns) where 15 ns delay is for the arc 205A-205B, 30 ns delay is for the arc 205B-205C, and 45 ns delay is for the arc 205C-205D. As used herein, an arc may be also referred to as a timing path or a routing path. The slack is determined as 30 ns from the clock driver period and the path delay (e.g., 120 ns–90 ns=30 ns). That is, the slack is the difference between the clock driver period and the path delay, and represents an amount of time available (beyond the minimum path delay) for routing along the path. From the slack amount for the path, a slack budget for each arc of the path can be designated as an amount of time available for routing between a specific pair of FPGA chips, beyond simply the minimum path delay. The slack budget for each arc is proportionally distributed based on path delay. As such, the slack budgets of the arc 205A-205B, 205B-205C, and 205C-205D are 5 ns, 10 ns, and 15 ns, respectively. In one example, the slack budget for each arc is determined based on Equation 1 below:

$$\text{slack\_budget(arc)} = \min_{pathsnarcEn}\left[\frac{\text{delay(arc)}}{\text{delay}(\pi)} * \text{slack}(\pi)\right]. \qquad \text{Equation 1}$$

In Equation 1, slack_budget(arc) represents the slack budget for a particular arc, delay(arc) represents a path delay for each arc, delay($\pi$) is the total path delay, and slack($\pi$) is the slack for a path.

FIG. 3 illustrates an example process for determining an arc delay, according to some embodiments of the disclosure. Convergence conditions are depicted in the figure, along with equations for determining a slack budget for each arc.

Figure 4:
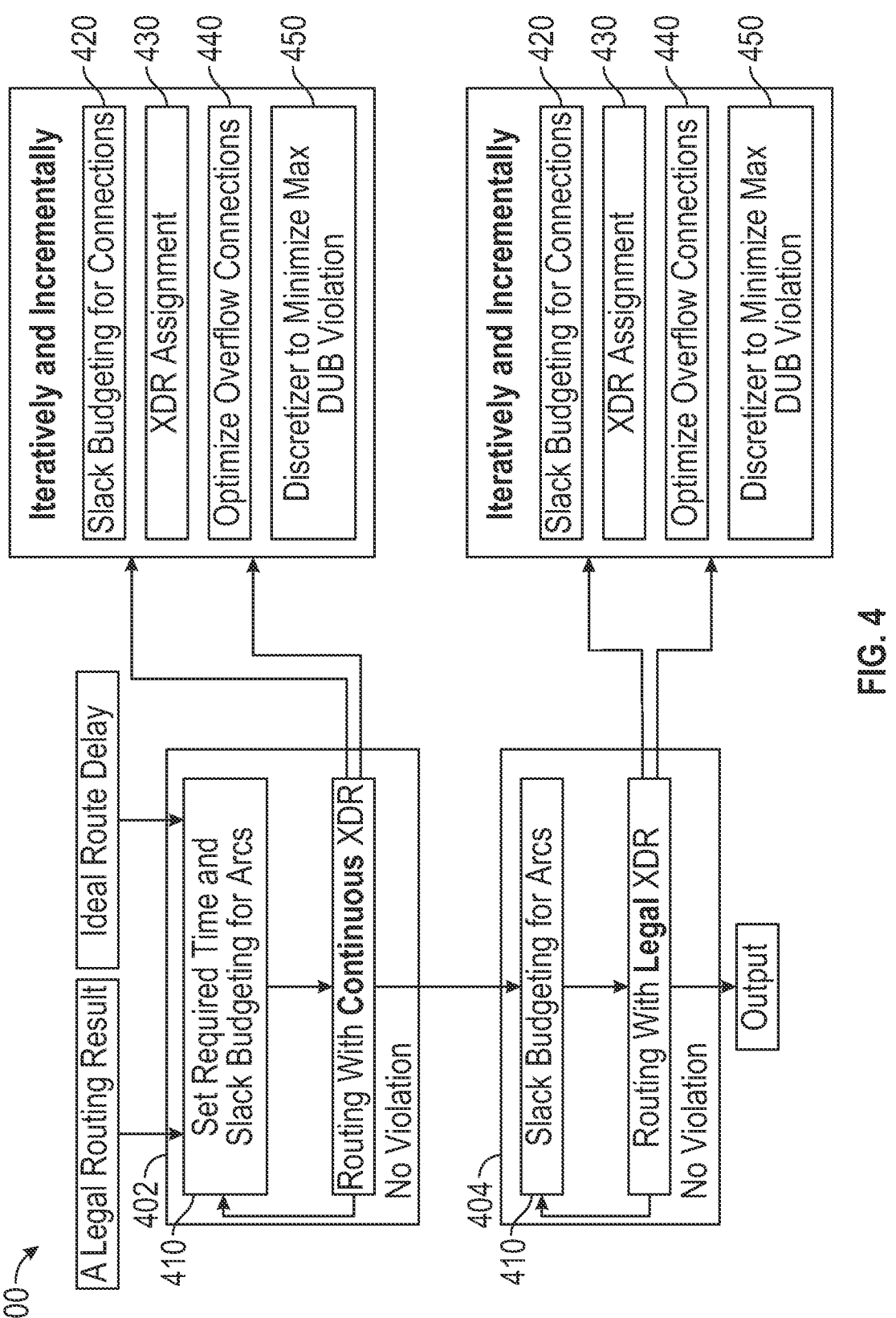
FIG. 4 illustrates a flowchart of a routing framework for preparing a circuit design for emulation, according to an embodiment of the disclosure.

FIG. 4 illustrates an example flowchart of a routing framework 400 for preparing a circuit design for emulation, according to an embodiment of the disclosure. For improved performance and convergence, slack budgeting and XDR assignment is used by the routing process.

The routing framework 400 includes determining slack budgeting for each arc (at 410), determining slack budgeting to FPGA connections (at 420), performing XDR assignment (at 430), performing overflow FPGA connection optimization (at 440), and performing discretization (at 450) for both the continuous domain (at 402) and the legal domain (at 404). In exemplary embodiments, an overflow (inter-FPGA) connection is avoided, to avoid congestion on a particular wire.

The legal domain refers to a solution space constrained by discrete XDR values (e.g., predetermined discrete XDR values). That is, the solution space is limited to the specific numbers that are predefined by the emulation software. The predetermined XDR values may be stored in a memory (e.g., the memory 1504 of FIG. 15) and provided by a processor (e.g., the processing device 1502 of FIG. 15). The continuous domain refers to the solution space that is not limited by the discrete XDR values. The XDR value can be an integer value or a decimal point value. In one example, XDR value is 10.77 for the continuous domain. In other examples, the XDR value is greater than or less than 10.77.

In the continuous domain 402, the XDR can be any arbitrary number. On the other hand, the XDR can only be the legal XDR defined by the architecture file for legal domain 404.

Figure 14:
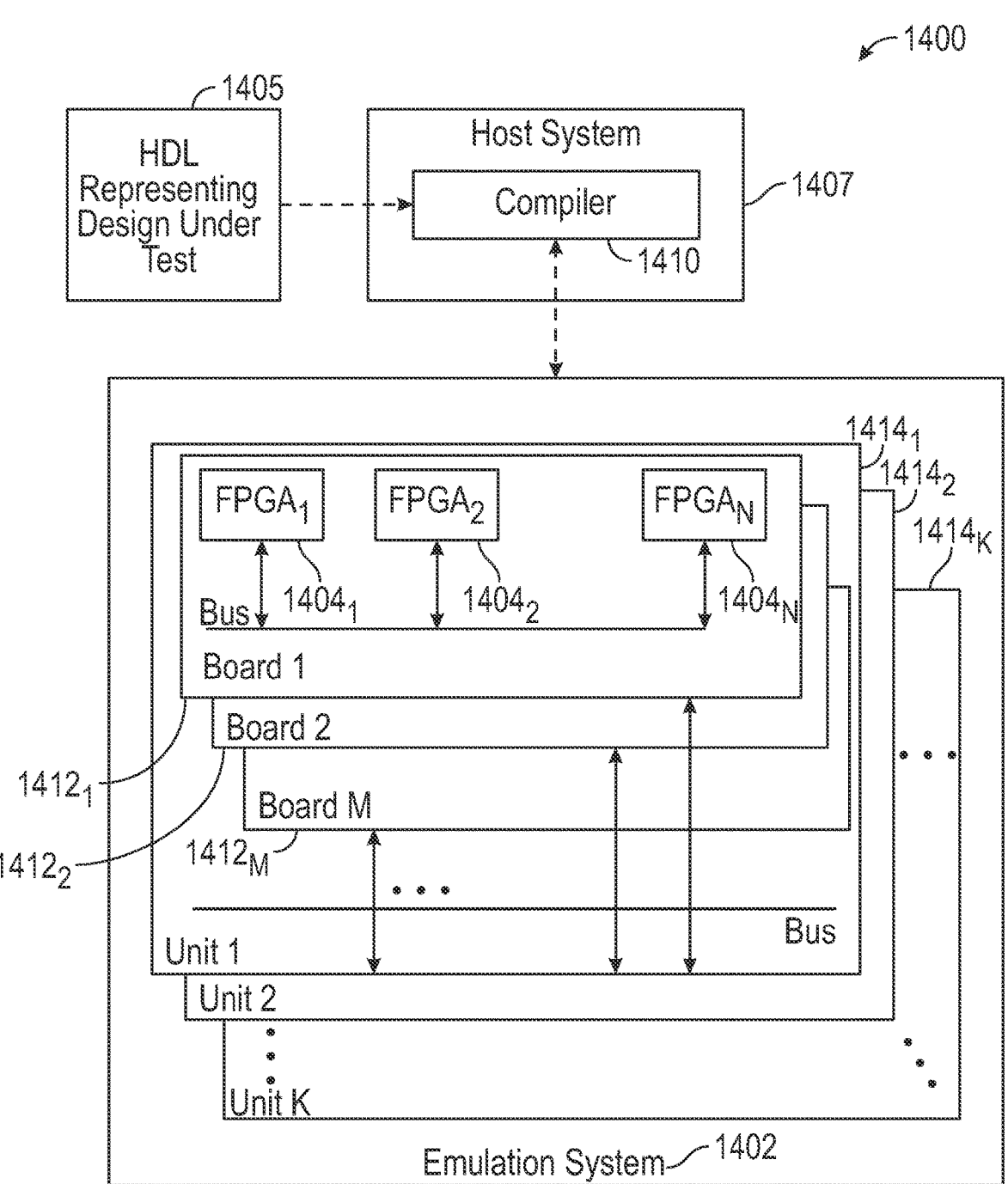
FIG. 14 depicts an example diagram of an example emulation system in accordance with some embodiments of the present disclosure.
Figure 15:
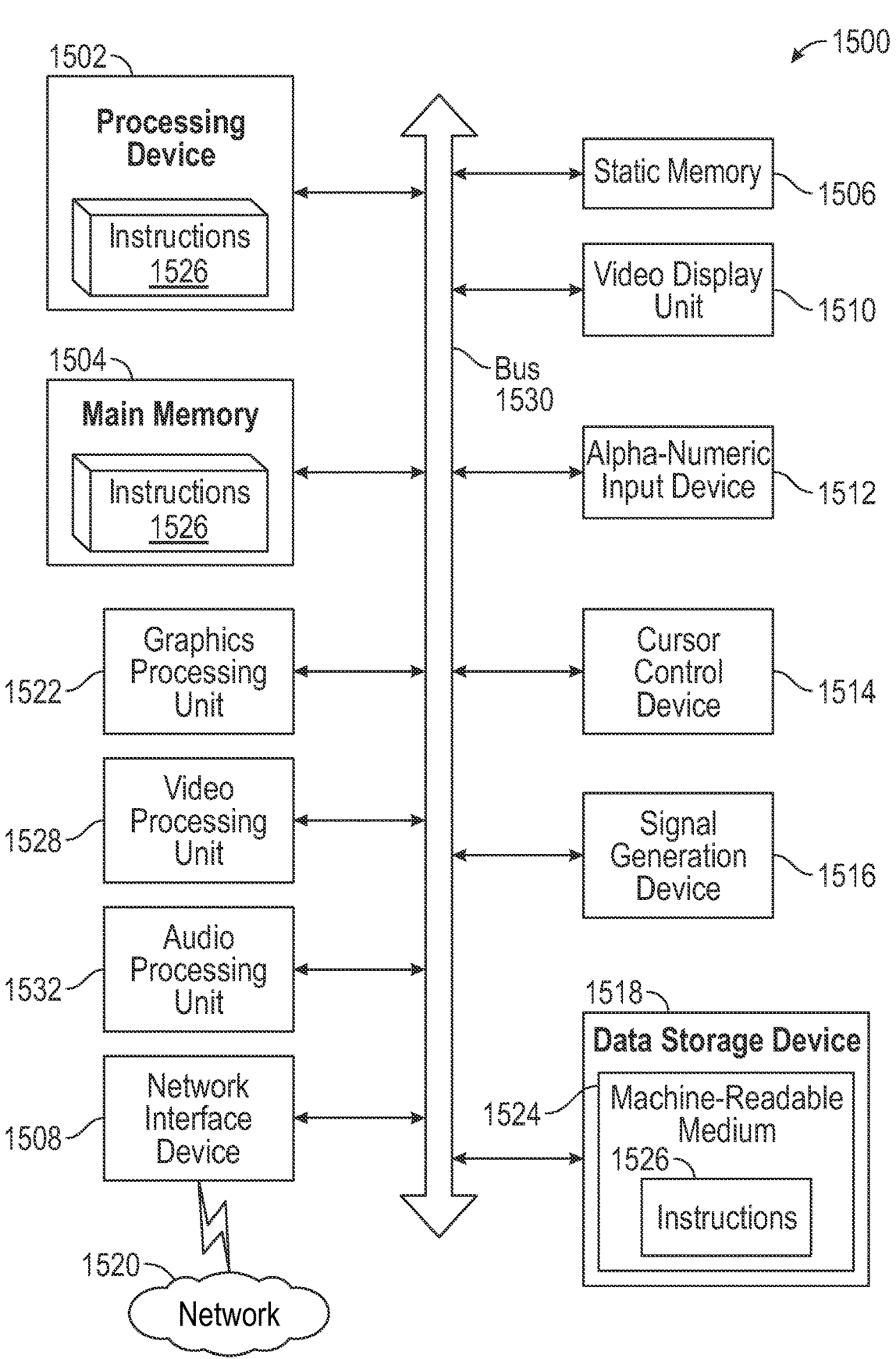
FIG. 15 depicts an example diagram of an example computer system in which embodiments of the present disclosure may operate.

The method of the routing framework 400 is performed by one or more processors (e.g., the processing device 1502 of FIG. 15) executing instructions (e.g., instructions 1526 of FIG. 15) stored in a memory device (e.g., the main memory 1504 or the machine-readable medium 1524 of FIG. 15). Further, the method of the routing framework 400 is performed by a compiler (e.g., the compiler 1410 of FIG. 14) as part of an emulation process.

In one example, determining slack budgeting for each arc includes determining a delay upper bound. The delay upper bound is defined as the largest delay value assigned to each arc. In one example, the delay upper bound is equal to the original arc delay plus the slack budget. When the arc delay exceeds the delay upper bound, the required time will be violated. The required time is time allotted to transmit a signal between the FPGA chips.

Given the required time, the slack budget is determined as described above with respect to FIG. 2. The original delay of the arc and the slack budget of the arc are added to determine the delay upper bound (DUB). The delay upper bound is determined based on Equation 2 below:

$$\text{upper\_bound(arc)=delay(arc)+slack\_budget(arc)} \qquad \text{Equation 2.}$$

In an exemplary embodiment depicted in FIG. 5, nodes 505A, 505B, 505C, and 505D have a total connection time of 120 ns. The original arc delay is 15 ns, 30 ns, and 45 ns for arcs 505A-505B, 505B-505C, and 505C-505D, respectively (as shown above each arc). Based on the connection time of 120 ns and the original arc delay, the proportional slack budget for each arc is 5 ns, 10 ns, and 15 ns, respectively (as shown below each arc). The slack budget may be determined according to Equation 1. Accordingly, the final delay upper bound (DUB) is determined as the original arc delay plus the slack budget, which is 20 ns (15 ns+5 ns), 40 ns (30 ns+10 ns), and 60 ns (45 ns+15 ns) for arcs 505A-505B, 505B-505C, and 505C-505D, respectively.

Figure 6:
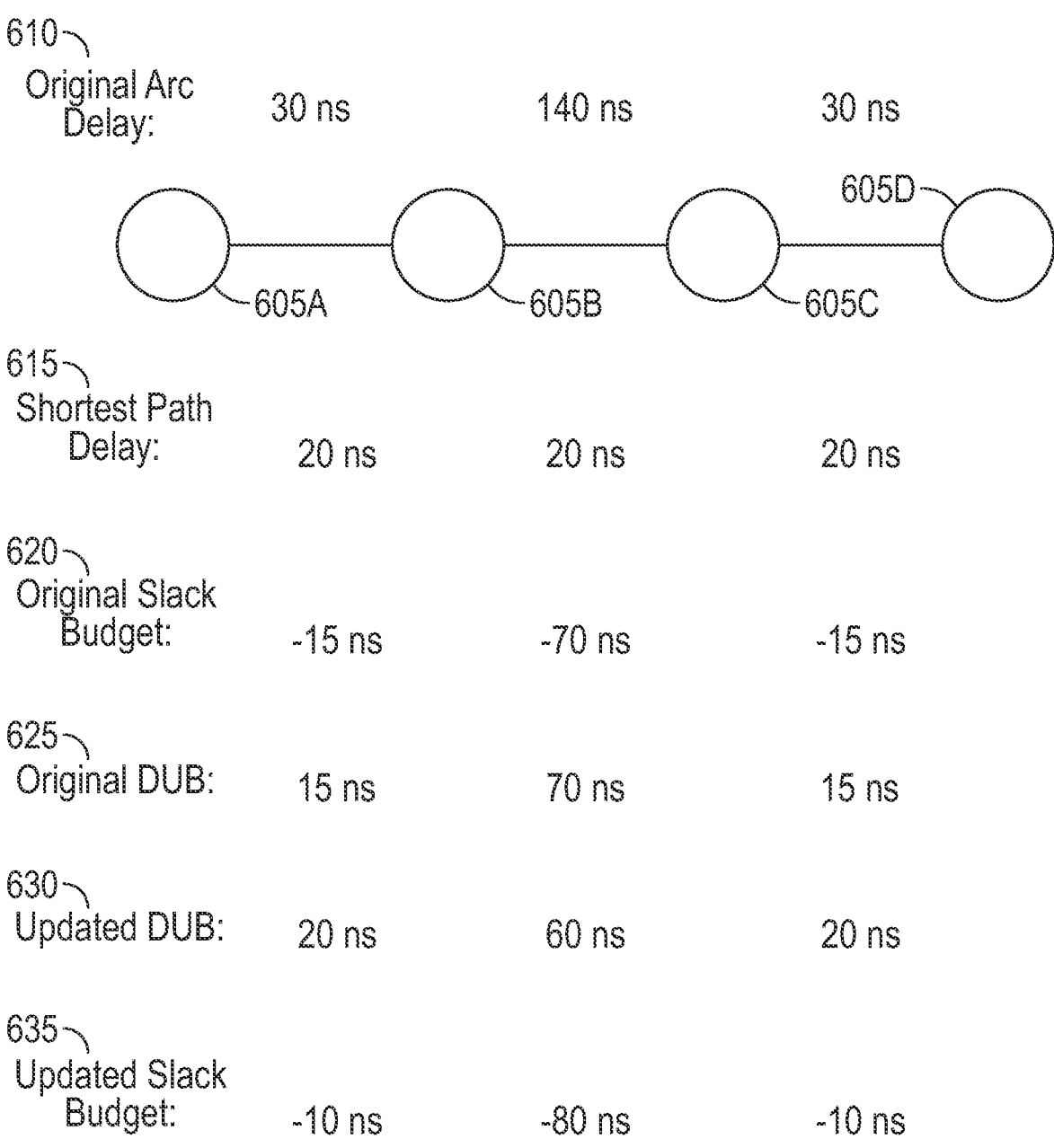
FIG. 6 illustrates example arcs with example upper and lower delay bounds, according to an embodiment of the disclosure.
Figure 7:
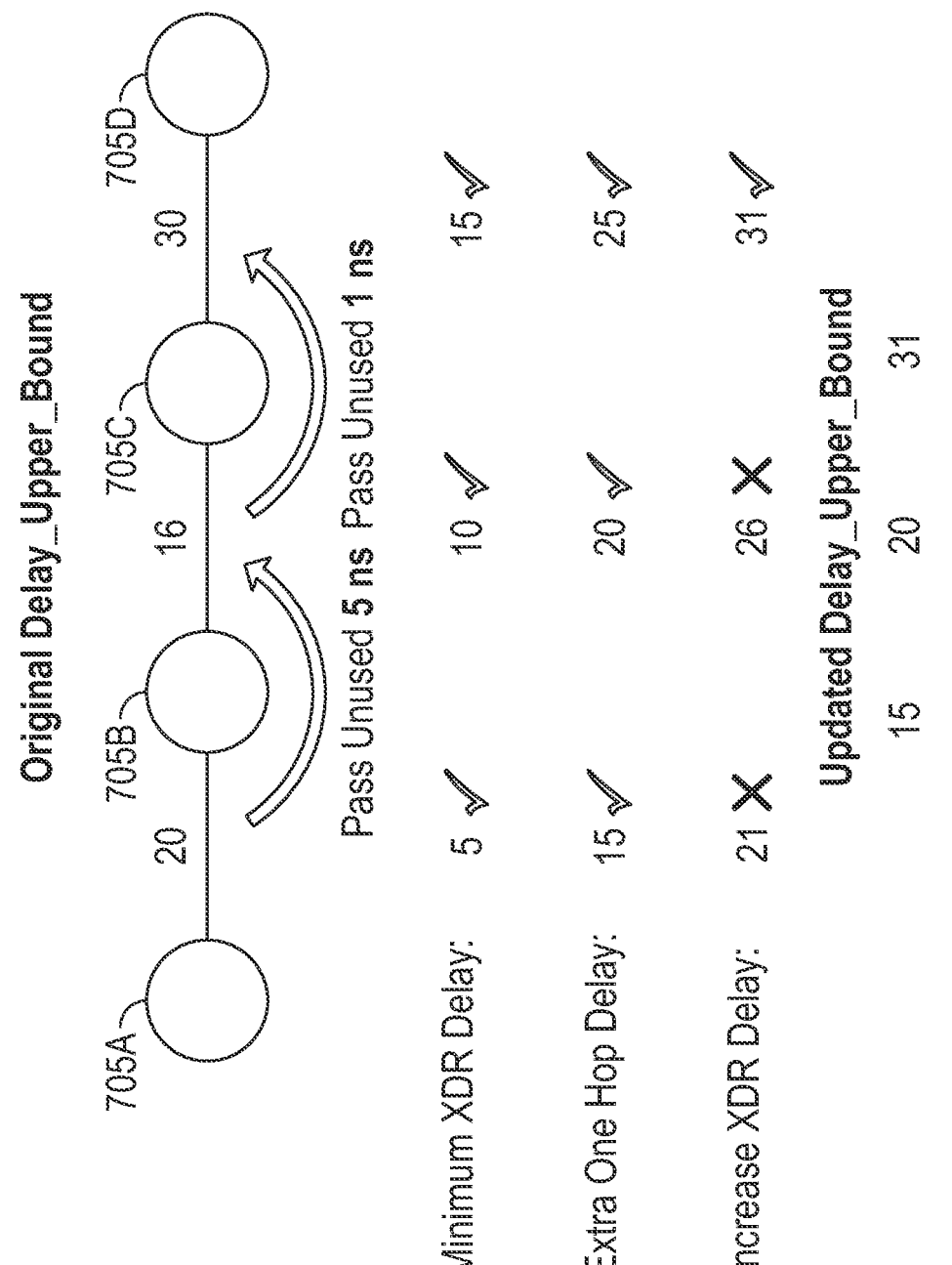
FIG. 7 illustrates an example of updated upper and lower delay bounds, according to an embodiment of the disclosure.

In one or more examples, the shortest path routing delay is used in determining a two level delay upper bound as is described with regard to the exemplary embodiments of FIG. 6 and FIG. 7. The shortest path delay is the minimum delay for the routing process. In one example, the shortest path delay is the delay from the shortest path routing that does not include detour in each corresponding routing wire. Further, the shortest path routing is determined based on an A*-search based algorithm, which is an algorithm based on heuristic methods that is used to find the optimal path between two nodes. When the delay upper bound is smaller than the shortest path delay, the routing process is not able to satisfy the delay upper bound. In one example, the two level delay upper bound includes determining the delay upper bound such that there is no unused delay upper bound within the arcs of an FPGA connection.

The shortest path delay is used in determining the delay upper bound, improving the routing process. In an exemplary embodiment depicted in FIG. 6, the process of modifying the delay upper bound by using shortest path routing is described. The shortest path routing delay is the minimum delay that the routing process can achieve. The exemplary embodiment of FIG. 6 depicts four nodes—605A, 605B, 605C, and 605D.

As shown in FIG. 6, the original arc delay 610 for arcs 605A-605B, 605B-605C, and 605C-605D are 30 ns, 140 ns, and 30 ns respectively. The original slack budget 620 for arcs 605A-605B, 605B-605C, and 605C-605D are –15 ns, –70 ns, and –15 ns respectively. As such, the original delay upper bound 625 of arcs 605A-605B and 605C-605D is 15 ns each (=30 ns arc delay—15 ns slack budget). The original delay upper bound 625 of 605B-605C is 70 ns (=140 ns delay—70 ns slack budget). Further, the shortest path delay 615 for each of arcs 605A-605B, 605B-605C, and 605C-605D is 20 ns.

Based on the shortest path delay 615 of 20 ns, the original delay upper bound 625 of arcs 605A-605B and 605C-605D is adjusted to 20 ns each, since the delay upper bound cannot be less than the shortest path delay. Accordingly, the delay upper bound of arc 605B-605C is reduced from 70 ns to 60 ns due to the additional 5 ns delay saved from each of the shortest path delay of arcs 605A-605B and 605C-605D. These values are shown as the updated DUB 630 in FIG. 6. From this, an updated slack budget 635 is determined for each arc. The updated slack budget 635 for arcs 605A-605B, 605B-605C, and 605C-605D become –10 ns, –80 ns, and –10 ns respectively.

After determining the delay upper bound and shortest path delay (also sometimes referred to herein as a delay lower bound), any unused delay is applied to the next FPGA connection. FIG. 7 depicts another exemplary embodiment of the present disclosure. As shown in FIG. 7, there are four nodes—705A, 705B, 705C, and 705D. An original delay upper bound is 20 ns, 16 ns, and 30 ns for arcs 705A-705B, 705B-705C, and 705C-705D, respectively. A minimum XDR delay of 5 ns, 10 ns, and 15 ns is also determined for arcs 705A-705B, 705B-705C, and 705C-705D, respectively.

After satisfying the minimum XDR delay and the shortest path delay, an extra hop delay and the delay with increased XDR is determined. An extra hop delay assumes a detour from the original shortest path, or the presence of one extra node in the routing. An extra one hop delay of 10 ns is added to the minimum XDR delay for each arc, resulting in values of 15 ns, 20 ns, and 25 ns for arcs 705A-705B, 705B-705C, and 705C-705D, respectively. In the exemplary environment of FIG. 7, an increased XDR delay of 6 ns is added, resulting in values of 21 ns, 26 ns, and 31 ns for arcs 705A-705B, 705B-705C, and 705C-705D, respectively.

If the current delay upper bound is smaller than the extra hop delay or XDR increased delay, the additional delay will be redistributed to the subsequent arc. That is, the XDR increased delay for arc 705A-705B is 21 ns, which is larger than the original delay upper bound 20 ns of arc 705A-705B. As such, the increased XDR delay value will not be used for this arc; rather, the extra one hop delay value of 15 ns will be used. Since 15 ns is now less than the original delay upper bound value of 20 ns for the arc, an extra 5 ns of time is available for use by a different arc.

The additional 5 ns from arc 705A-705B is redistributed to arc 705B-705C. However, the extra one hop delay for this arc is only 20 ns, and thus the entire 5 ns redistribution is not needed. That is, the original delay upper bound value of 16 ns is increased to the extra one hop delay value of 20 ns, which is an increase of 4 ns. As such, there still remains an extra 1 ns for allocation to the last arc of 705C-705D. The original delay upper bound value of 30 ns for arc 705C-705D is increased by the unused 1 ns slack budget to 31 ns, which matches the increased XDE delay value for that arc. After this process, an updated delay upper bound value is determined for each arc to be 15 ns, 20 ns, and 31 ns for arcs 705A-705B, 705B-705C, and 705C-705D, respectively.

After the slack budget is assigned to each arc, the delay is assigned to each FPGA connection as one routing path may correspond to several FPGA connections. A routing path corresponds to one arc. Further, a routing path may be divided into one or more FPGA connections.

FIGS. 8A-8G illustrate the process of assigning delay to FPGA connections. The process of FIGS. 8A-8G may be executed as instructions (e.g., the instructions 1526 of FIG. 15) stored in a memory (e.g., the main memory 1504 or the machine-readable medium 1524 of FIG. 15) by one or more processors (e.g., the processing device 1502 of FIG. 15). In FIGS. 8A-8G, an arc 805A-805B is illustrated between nodes 805A and 805B. The arc connects the FPGA chip F01 with the FPGA chip F05 and passes through the FPGA chip F02, F03, and F04. Congestion for each connection is determined based on the sum of wire XDR/wire capacity.

In one example, a minimum delay is assigned for each FPGA connection. The minimum delay is dependent on the type of FPGA connection. For example, low-voltage differential signaling (LVDS) and multi-gigabit transceiver (MGT) FPGA connections have a different minimum XDR delay. FIG. 8A illustrates a desired delay (e.g., a minimum delay) between each FPGA chip in an example embodiment. From chip F01 (805A) to F02, the desired delay is 4 ns. From chip F02 to F03, the desired delay is 4 ns. From chip F03 to chip F04, the desired delay is 4 ns. From chip F04 to chip F05 (805B), the desired delay is 16 ns. Thus, the total delay for the arc 805A-805B from chip F01 to chip F05 is 28 ns. For an original arc slack budget of 68 ns, the remaining arc budget is 40 ns (e.g., 68 ns–28 ns=40 ns), after assigning minimum delay for each FPGA connection.

In FIG. 8B, the remaining budget of 40 ns is proportionally assigned to the FPGA chips F02-F04 based on the corresponding congestion values of the connections. The congestion values represent an amount of congestion expected on the physical wire connection between the FPGA chips, and is variable depending on the specific type of physical wire present. The congestion value for the connection between FPGA chip F01 to FPGA chip F02 is 0.5, the congestion value for the connection between FPGA chip F02 to FPGA chip F03 is 2.0, the congestion value for the connection between FPGA chip F03 to FPGA chip F04 is 1.0, and the congestion value for the connection between FPGA chip F04 to FPGA chip F05 is 0.8.

For example, the remaining slack budget assigned to the connection between the FPGA chip F01 to FPGA chip F02 is determined based on 40×(0.5/(0.5+2.0+1.0+0.8))=4.7 ns. The slack budget for the FPGA connection between FPGA chip F01 to FPGA F02 is determined based on the proportionally assigned slack budget and the delay of the connection. The minimum delay of the FPGA connection between FPGA chip F01 to FPGA F02 is 4 ns and the assigned remaining slack budge is 4.7 ns, accordingly, the slack budget of the FPGA connection between FPGA chip F01 to FPGA F02 is 8.7 ns (e.g., 4.7 ns+4 ns=8.7 ns). Similarly, the slack budget between each of the FPGA connections can be determined in arc 805A-805B.

Figure 8C:
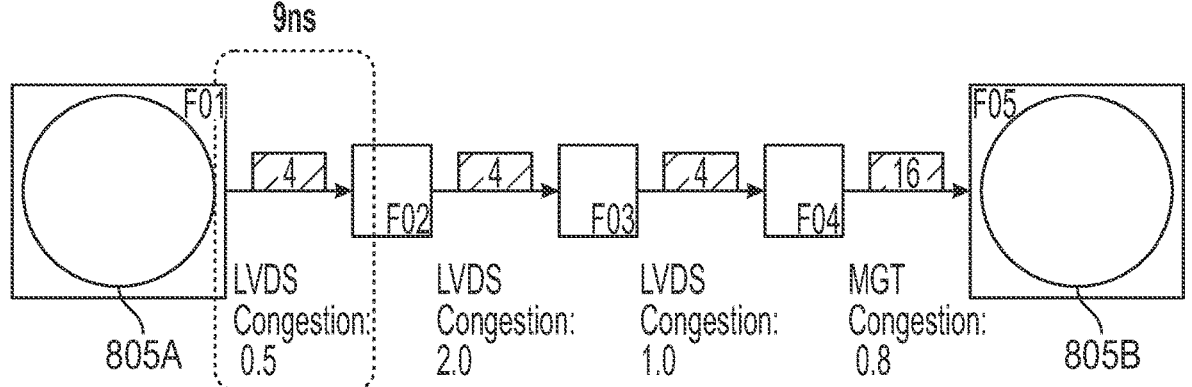
FIG. 8C illustrates example chip to chip connections and a portion of a process for assigning a slack budget for the chip to chip connections, according to an embodiment of the disclosure.

In FIG. 8C, the closest legal XDR value is assigned to the FPGA connection between FPGA chip F01 to FPGA F02. The delay and XDR transformation ratio is one. Further, the XDR of 8.7 is determined based on the ratio, (XDR)/(XDR transformation ratio). The XDR is legalized (rounded up) to the integer value of 9 ns. In one or more examples, legalize includes rounding a value to the nearest integer. As such, the slack budget of the FPGA connection between FPGA chip F01 to chip F02 is 9 ns. Similarly, the slack budget between each of the FPGA connections can be determined in the arc.

Figure 8D:
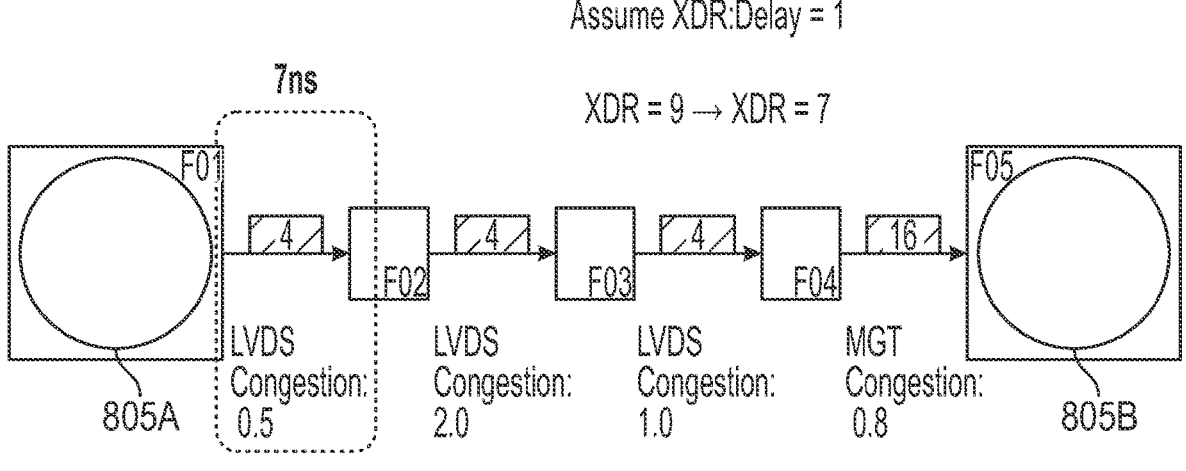
FIG. 8D illustrates example chip to chip connections and a portion of a process for assigning a slack budget for the chip to chip connections, according to an embodiment of the disclosure.

In FIG. 8D, it is determined where existing wire XDR can be reused. In the exemplary environment of FIG. 8D, the existing wire (trace) XDR in the FPGA connection between chip F01 and F02 is reused, bringing the XDR value down from 9 ns to 7 ns. Accordingly, the slack budget for the connection between the FPGA chip F01 and the FPGA chip F02 is 7 ns. Similarly, the slack budget between each of the FPGA connections can be determined in the arc.

In one example, each FPGA connection includes a data structure to restore an XDR value of each trace (e.g., wire) of the FPGA connection. One XDR value is saved for trace of the FPGA connection. In other examples, more than one XDR value is saved for each trace of an FPGA connection. A trace of the FPGA connection may be included in multiple fanouts, the trace may be connected to multiple routing targets. In such an example, even though a trace is connected to multiple targets, a single XDR value is stored for the trace.

Figures 8E, 8F:
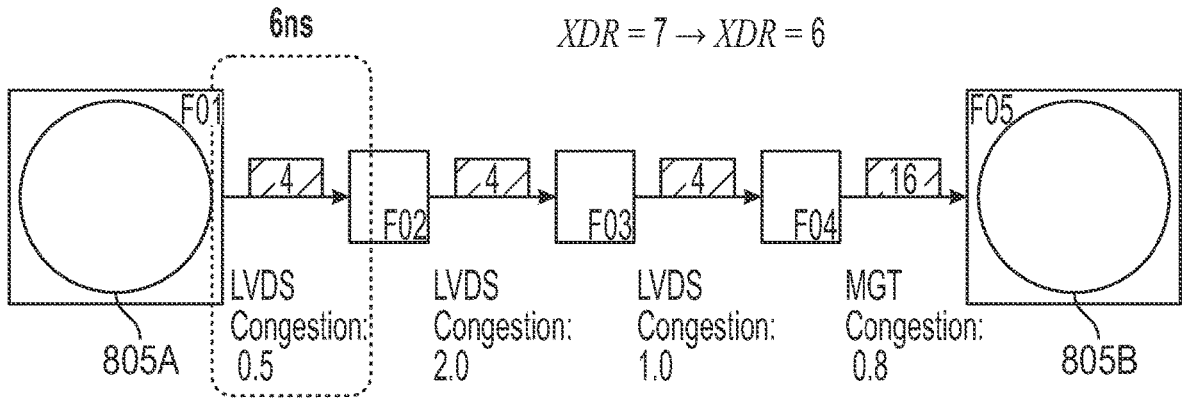
FIG. 8E illustrates example chip to chip connections and a portion of a process for assigning a slack budget for the chip to chip connections, according to an embodiment of the disclosure.
FIG. 8F illustrates example chip to chip connections and a portion of a process for assigning a slack budget for the chip to chip connections, according to an embodiment of the disclosure.

In FIG. 8E, the lower non-fully-utilized XDR is used in the connections. In the exemplary environment of FIG. 8E, reusing the lower non-fully utilized XDR brings the XDR value between FPGA chips F01 (805A) and F02 down from 7 ns to 6 ns. Accordingly, the slack budget in this connection is set to 6 ns. Similarly, the slack budget between each of the FPGA connections can be determined in the arc. In one or more examples, the XDR for a FPGA connection is saved for each trace of the of an FPGA connection. In a non-fully-utilized XDR, the number of traces of the corresponding FPGA connection is smaller than the XDR value.

In FIG. 8F, the delay for the connection between each pair of FPGA chips is determined based on the difference between the slack budget and the desired delay for the connection. That is, in the exemplary environment, the XDR value between chip F01 (805A) and F02 is 6 ns. The required minimum delay of 4 ns is subtracted from that to yield a closest legal delay value of 2 ns. Accordingly, delay for the connection between the FPGA chips F01 (805A) and F02 is 2 ns (e.g., 6 ns−4 ns). Similarly, the slack budget between each of the FPGA connections can be determined in the arc.

Figure 8G:
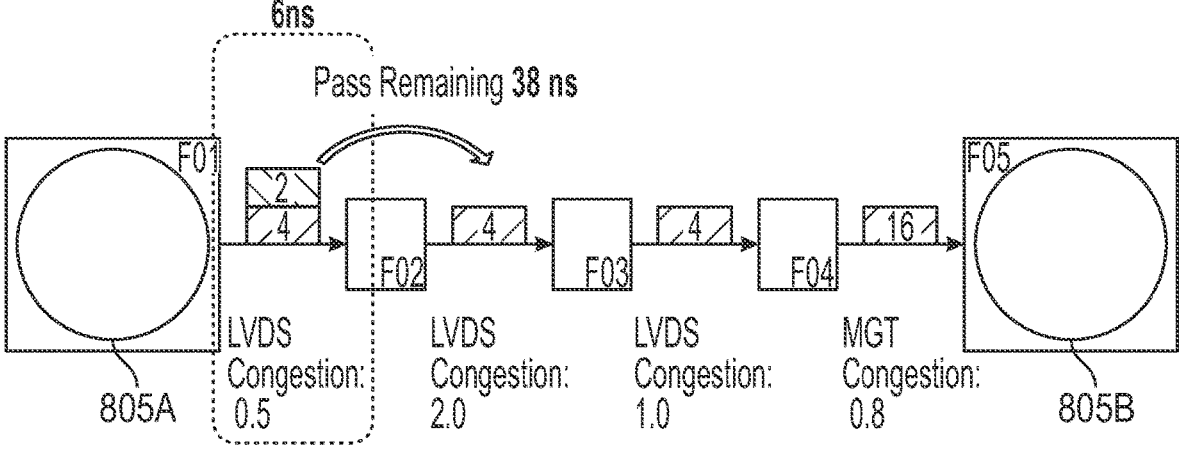
FIG. 8G illustrates example chip to chip connections and a portion of a process for assigning a slack budget for the chip to chip connections, according to an embodiment of the disclosure.

FIG. 8G depicts an exemplary process for applying a remaining delay to the next connection in the arc 805A-805B. For example, if the total amount of delay is 40 ns before slack budgeting calculation of the arc, then the remaining 38 ns (e.g., 40 ns−2 ns) left over at chip F02 is applied to the next FPGA to FPGA connection (i.e., the connection from chip F02 to F03). The process continues all the way through chip F05.

The processes of FIG. 8A-8G may be performed by one or more processors (e.g., the processing device 1502 of FIG. 15) executing instructions (e.g., instructions 1526 of FIG. 15) stored in a memory device (e.g., the main memory 1504 or the machine-readable medium 1524 of FIG. 15). Further, the processes of FIG. 8A-8G are performed by a compiler (e.g., the compiler 1410 of FIG. 14) as part of an emulation process.

In one or more examples, pattern routing includes determining all of the routing paths with detour 2 in the pre-routing stage. Pattern routing may be performed by one or more processors (e.g., the processing device 1502 of FIG. 15) executing instructions (e.g., instructions 1526 of FIG. 15) stored in a memory device (e.g., the main memory 1504 or the machine-readable medium 1524 of FIG. 15). Further, the pattern routing is performed by a compiler (e.g., the compiler 1410 of FIG. 14) as part of an emulation process. In one example, all FPGA pairs are checked to build detour paths. Detour paths are alternative paths that are longer than the shortest paths. For example, between FPGA pairs, a shortest path may pass through one other FPGA. A detour path passes through additional FPGAs before reaching the target FPGA. The number of detours corresponds to the number of additional FPGAs that the path passes through as compared to the shortest path. In one example, the number of detours in a detour path is limited to improve compile time. For example, the number of detours may be set to two.

Figure 9:
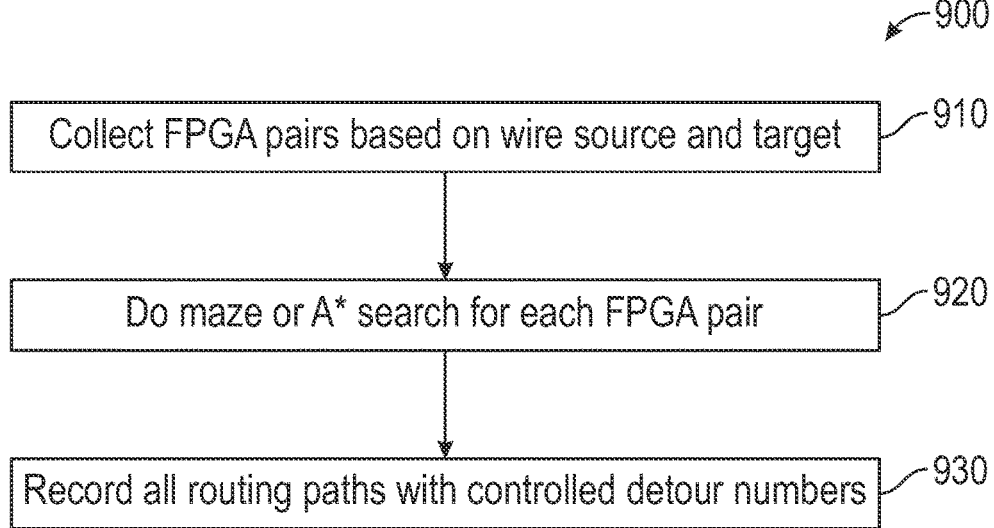
FIG. 9 illustrates a flowchart of a method for determining routing paths, according to an embodiment of the disclosure.

FIG. 9 illustrates a flowchart of a method 900 for generating routing paths in a pre-routing stage, according to an embodiment of the disclosure. The method 900 includes at 910, collecting FPGA pairs based on a wire source and target for a connection. At 920, a maze or A* search algorithm is conducted for each FGPA pair. This may be conducted with controlled detour numbers to find all routing paths between each FPGA pair. In exemplary embodiments, there are two controlled detours. That is, the routing path for each wire will consist of a shortest path, a first detour (one extra hop), and a second detour (two extra hops). Maze and A* search are circuit routing algorithms. At 930, the routing paths are recorded with controlled detour numbers for each routing path.

In one or more examples, the routing paths table is generated before routing is performed, improving the compile time of the emulation process as routing is not performed during each routing iteration. Further, the routing paths are generated based on the slack budgeting.

Figure 10:
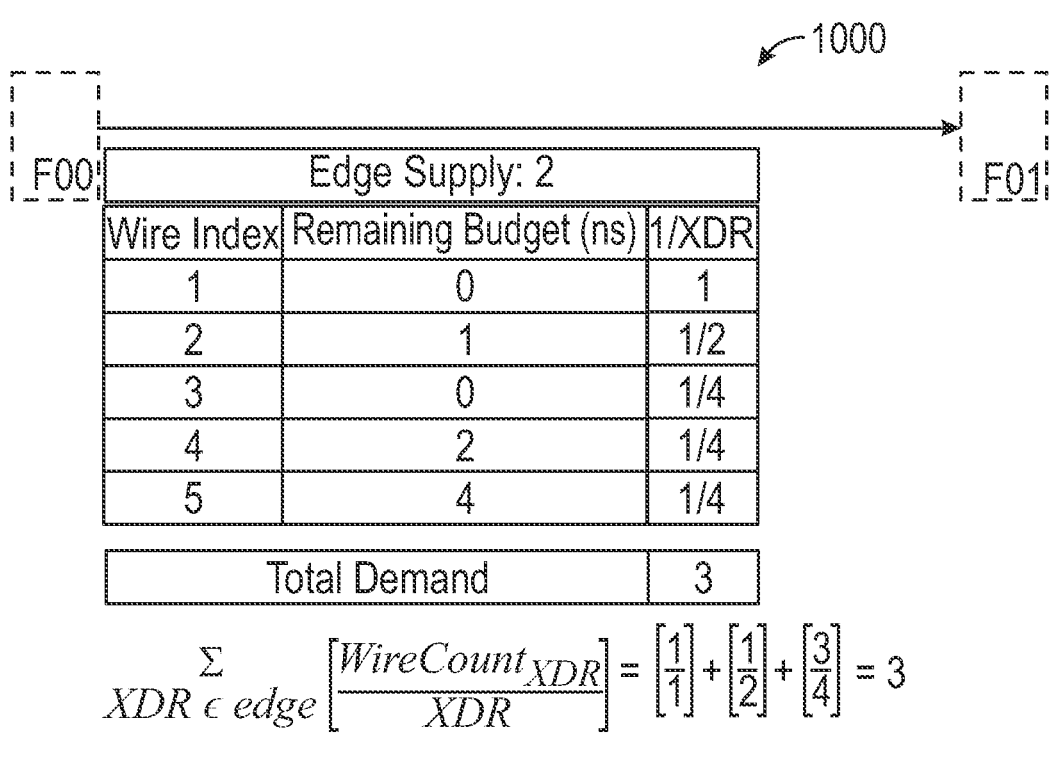
FIG. 10 illustrates table of a total demand for a chip to chip connection, according to an embodiment of the disclosure.

FIG. 10 illustrates a table 1000 of the total demand value for a connection between the FPGA chip F00 and the FPGA chip F01. The congestion value for the connection is a ratio of demand value to capacity of the connection. The demand value corresponds to a combined XDR for a FPGA connection. The demand value is determined as being the reciprocal of the routing target XDR (e.g., sum of each XDR of the FPGA connection). For example, the demand is determined based on Equation 3 below:

$$\sum_{XDR \in edge} \frac{WireCount_{XDR}}{XDR}. \qquad \text{Equation 3}$$

Based on the table 1000, the total demand value is the sum of the wire count divided by the XDR value, which is $(1/1)+(\frac{1}{2})+(\frac{1}{4})+(\frac{1}{4})+(\frac{1}{4})=3$. Further, the congestion value is $\frac{3}{10}$, as the capacity (e.g., number of traces) of the connection is 10.

In one or more examples, as the routing table for all routing targets is precomputed, the path associated with the best cost during routing is selected, improving the pre-computation and multi-threading. A cost includes one or more of a congestion, delay, and detour number, etc., for each routing path. The minimum cost routing path may be selected from the routing table. In one example, a processing system (e.g., the computer system 1500 of FIG. 15) selects the minimum cost routing path from the routing table stored in a memory (e.g., the memory 1504 of FIG. 15)/(e.g., the processing device 1502 of FIG. 15).

Figure 11:
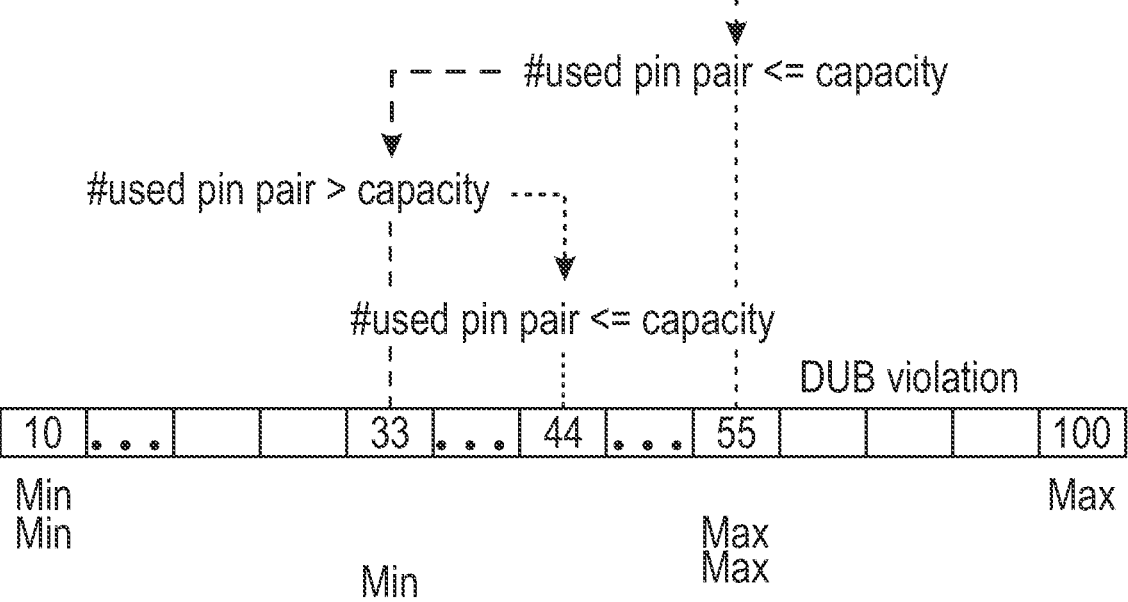
FIG. 11 illustrates pin pair capacity, according to an embodiment of the disclosure.

In one or more examples, based on the DUB of each routing target, the discretization process minimizes the maximum wire DUB violation with a hard capacity constraint. That is, the discretization result needs to be less than or equal to the DUB. If it is not, then it is a DUB violation. Discretization results larger than DUB would be unrealistic given the physical capacity restraints of the physical wires present between the FPGA chips. The hard capacity constraint is the number of pin pairs in an FPGA connection. FIG. 11 illustrates an exemplary binary-search based optimization process. The wire XDR and the number of pin pairs of each routing target is determined. If the pin pair number is less than or equal to the FPGA to FPGA connection capacity, a binary search in the range of the minimum and maximum violation is performed for the FPGA to FPGA connection. The wire DUB violation is determined based on the difference between the wire XDR delay and the wire DUB. Further, the wire XDR delay is the combination of the wire DUB violation and the wire DUB.

Figure 12:
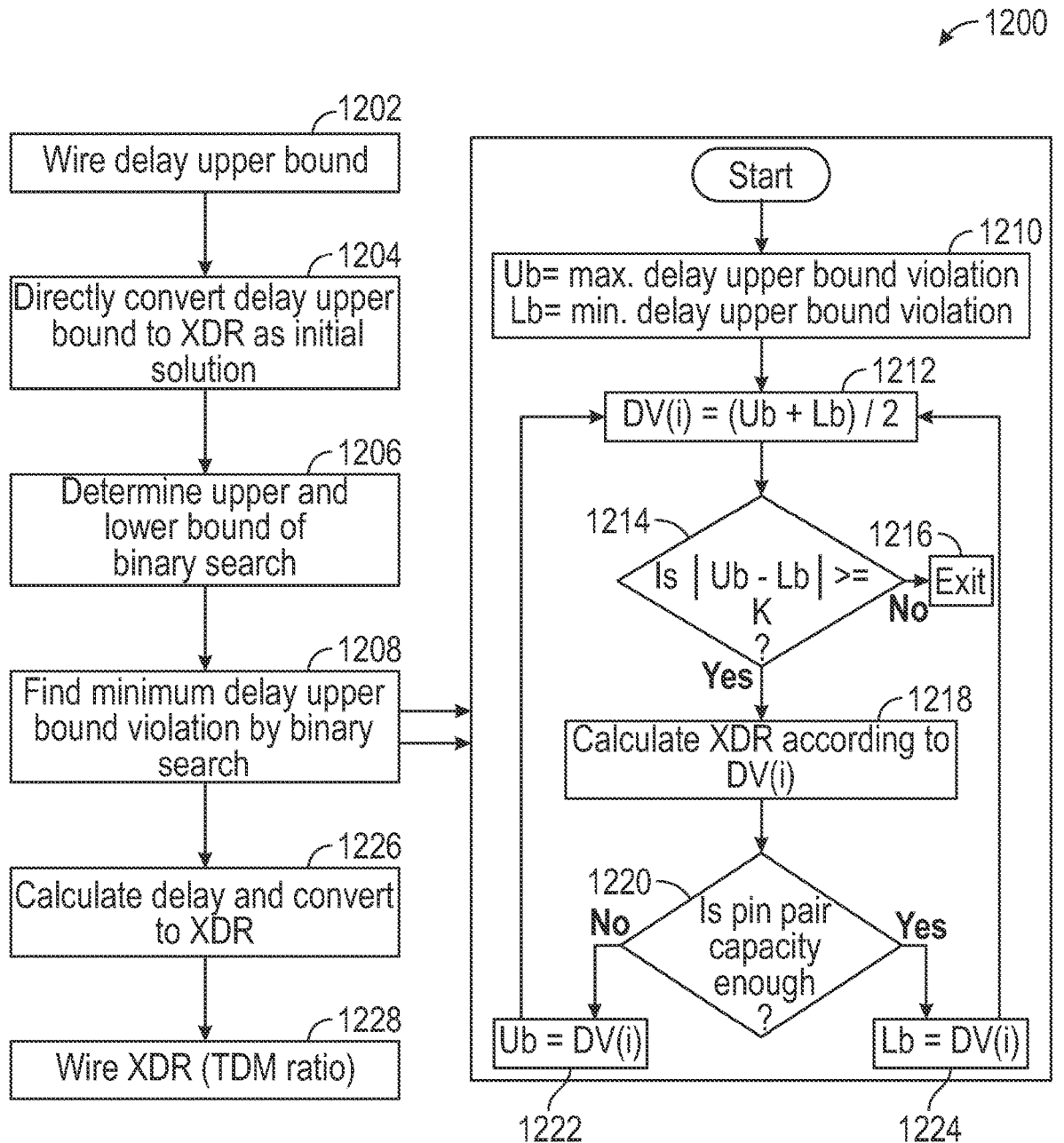
FIG. 12 illustrates a method for performing a binary search for the minimum violation between upper and lower delay bounds, according to an embodiment of the disclosure.

FIG. 12 illustrates a flowchart of a method 1200 for performing a binary search to a minimum violation associated with a delay upper bound, according to an embodiment of the disclosure. The method 1200 is performed by one or more processors (e.g., the processing device 1502 of FIG. 15) executing instructions (e.g., instructions 1526 of FIG. 15) stored in a memory device (e.g., the main memory 1504 or the machine-readable medium 1524 of FIG. 15). Further, the method 1200 is performed by a compiler (e.g., the compiler 1410 of FIG. 14) as part of an emulation process. The binary-search based discretizing is performed for each FPGA chip to FPGA chip connection. While specific steps are depicted in method 1200, there may be fewer or additional steps in other embodiments. Further, one or more steps may occur in a different order than depicted in exemplary FIG. 12.

The method 1200 begins at 1202, at which a wire delay upper bound is set. Then, at 1204, the wire delay upper bound is directly converted to XDR as an initial solution. The upper and lower bound of the binary search is determined at 1206. The minimum delay upper bound violation is determined at 1208 by the binary search.

In exemplary embodiments, 1208 may comprise a series of sub-steps of method 1200. That is, 1208 may be accomplished by 1210-1224 of method 1200 of FIG. 12. At 1210, a maximum delay upper bound violation (Ub) and minimum delay upper bound violation (Lb) are set. The maximum delay upper bound violation is a delay constraint of an arc. Further, the maximum delay upper bound violation is equal to the original arc delay and the slack budget for the arc. The minimum delay upper bound violation is the shortest path delay.

At 1212, DV(i) is determined based on the delay upper bound of routing target "i" as an average of the maximum delay upper delay bound violation (Ub) and the minimum delay upper bound violation (Lb). As used herein, the term DV refers to a delay upper bound violation. At 1214, a determination is made whether or not the magnitude of the difference between the upper and lower delay bounds is greater than K. K is a relatively small constant, about 1 ps. At 1216, if the magnitude of the difference between the upper and lower delay bounds is not greater than or equal to K, the method ends. At 1218, if the magnitude of the difference between the upper and lower delay bounds is greater than or equal to K, XDR is determined based on DV(i). At 1220, a determination as to whether or not the pin pair capacity supports the XDR is determined. If so, the pin pair capacity supports the XDR, and the minimum delay upper bound violation (Lb) is set to DV(i). The method then returns to 1212. If the pin pair capacity does not support the XDR, the maximum delay upper delay bound violation (Ub) is set to DV(i) at 1222, and the method returns to 1212.

In exemplary embodiments, the initial binary search range is set to be between the minimum and maximum delay upper bound for the selected FPGA chip to FPGA chip connection. The wire XDR and the pin pair number of each routing target is determined. If the pin pair number is smaller than the pin pair capacity, the lower bound of the binary search is relaxed as the current wire delay upper bound. If the pin pair number is larger than pin pair capacity, the upper bound of the binary search is set to current wire delay upper bound. The process terminates when the difference between violation upper bound and lower bound is smaller than about 1 ps, at 1216. In other examples, a threshold greater than 1 ps is used as the termination condition.

Figure 13:
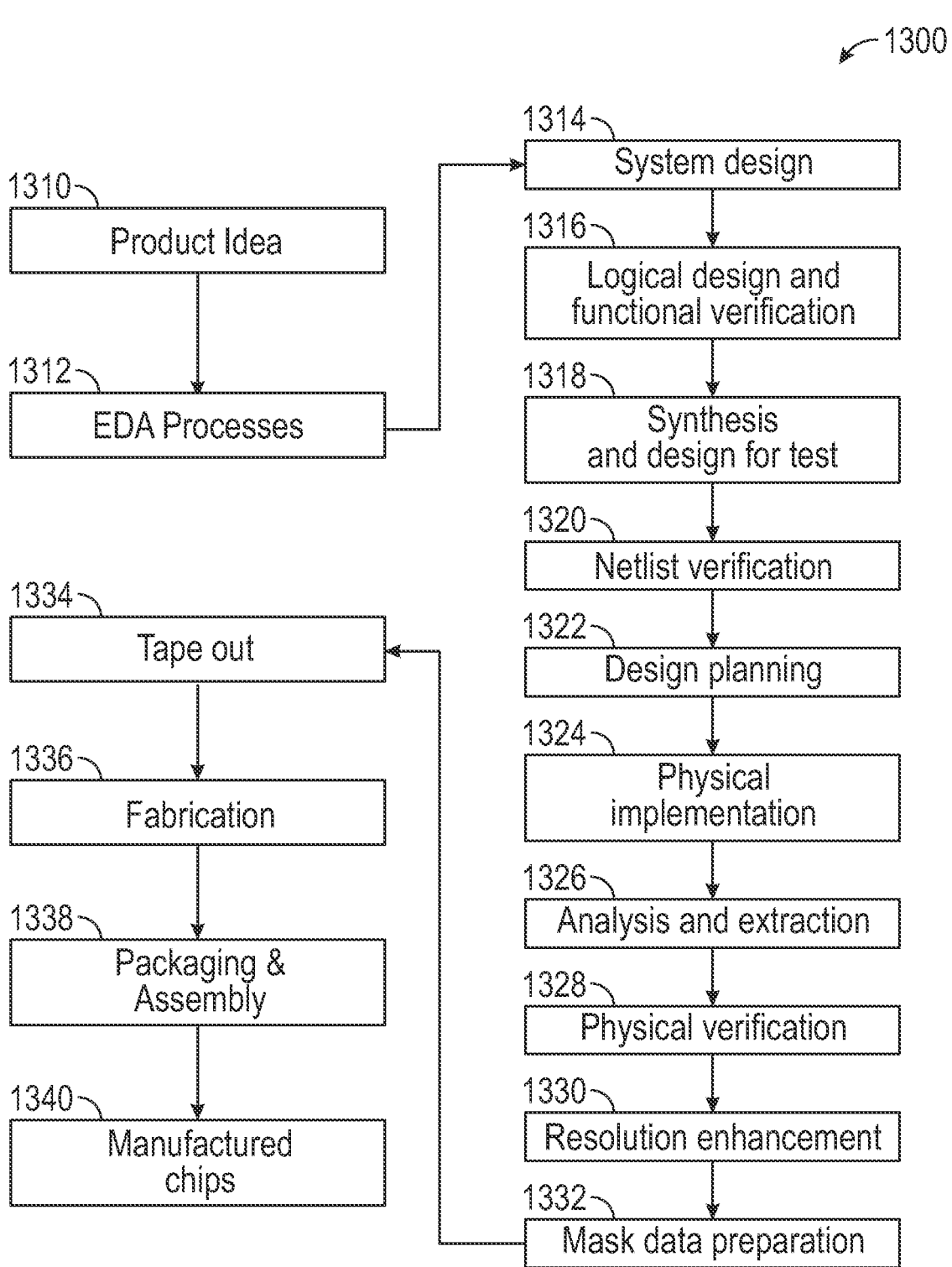
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed to produce the finished integrated circuit 1340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a less detailed description adds more useful detail into the design description, for example, more details for the modules that include the description. The lower levels of representation that are less detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 13. The processes described by be enabled by EDA products (or tools).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1500 of FIG. 9, or host system 1407 of FIG. 14) may be used to store the programs and data structures that are used by some or all of the EDA products described herein, and products used for development of cells for the library and for physical and logical design that use the library.

FIG. 14 depicts a schematic diagram of an example emulation environment 1400. An emulation environment 1400 may be configured to verify the functionality of the circuit design. The emulation environment 1400 may include a host system 1407 (e.g., a computer that is part of an EDA system) and an emulation system 1402 (e.g., a set of programmable devices such as Field Programmable Gate Arrays (FPGAs) or processors). The host system generates data and information by using a compiler 1410 to structure the emulation system to emulate a circuit design. A circuit design to be emulated is also referred to as a Design Under Test ('DUT') where data and information from the emulation are used to verify the functionality of the DUT.

The host system 1407 may include one or more processors. In the embodiment where the host system includes multiple processors, the functions described herein as being performed by the host system can be distributed among the multiple processors. The host system 1407 may include a compiler 1410 to transform specifications written in a description language that represents a DUT and to produce data (e.g., binary data) and information that is used to structure the emulation system 1402 to emulate the DUT. The compiler 1410 can transform, change, restructure, add new functions to, and/or control the timing of the DUT.

The host system 1407 and emulation system 1402 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 1402.11. The host system 1407 and emulation system 1402 can exchange data and information through a third device such as a network server.

The emulation system 1402 includes multiple FPGAs (or other modules) such as FPGAs 1404$_1$ and 1404$_2$ as well as additional FPGAs to 140$_{4N}$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. The slack budgeting and discretization systems and methods discussed herein may be applied to pin pairs of these FPGAs. For example, a slack budget may be determined for a path between FPGA 1404$_1$ and 1404$_2$. While an emulator may include FPGAs, embodiments of emulators can include other types of logic blocks instead of, or along with, the FPGAs for emulating DUTs. For example, the emulation system 1402 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $1404_1$-$1404_N$ may be placed onto one or more boards 14131 and 14132 as well as additional boards through $1412_M$. Multiple boards can be placed into an emulation unit 14151. The boards within an emulation unit can be connected using the backplane of the emulation unit or any other types of connections. In addition, multiple emulation units (e.g., 14151 and 14152 through $1414_K$) can be connected to each other by cables or any other means to form a multi-emulation unit system.

For a DUT that is to be emulated, the host system 1407 transmits one or more bit files to the emulation system 1402. The bit files may specify a description of the DUT and may further specify partitions of the DUT created by the host system 1407 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1407 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA.

The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1407 and/or the compiler 1410 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1405 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

FIG. 9 illustrates an example machine of a computer system 1500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1502 may be configured to execute instructions 1526 for performing the operations and steps described herein.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1516 (e.g., a speaker), graphics processing unit 1522, video processing unit 1528, and audio processing unit 1532.

The data storage device 1518 may include a machine-readable storage medium 1524 (also known as a non-transitory computer-readable medium) on which is stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:

receiving a physical circuit design file that includes physical circuit partitions that are each mapped to at least one of a first chip, a second chip, and a third chip, wherein the first chip and the second chip are connected by a first timing path, the second chip and the third chip are connected by a second timing path, wherein the first timing path and the second timing path each have a desired delay;

determining a total slack budget based on a driver clock period and a sum of the desired delay for the first timing path and the desired delay for the second timing path;

proportioning the total slack budget to the first timing path and the second timing path based on the desired delay for each of the first timing path and the second timing path; and adjusting a routing of electronic signals along the first timing path and the second timing path, based on the proportioned slack budget, including determining, for each of the first timing path and the second timing path, a delay upper bound and selecting a corresponding data-multiplexing value that satisfies the delay upper bound.

2. The method of claim 1, wherein the delay upper bound is based on the desired delay and the proportioned slack budget for each of the first timing path and the second timing path.

3. The method of claim 2, wherein the delay upper bound is at least equal to a shortest path delay for each of the first timing path and the second timing path.

4. The method of claim 2, further comprising:

determining an updated delay upper bound for each of the first timing path and the second timing path, wherein the updated delay upper bound is based at least in part on the delay upper bound and a shortest path delay for each of the first timing path and the second timing path.

5. The method of claim 1, wherein the proportioning the total slack budget to the first timing path and the second timing path is based on a congestion value of each respective timing path.

6. The method of claim 5, wherein the congestion value of each timing path is determined based on wire capacity.

7. The method of claim 1, wherein the desired delay is based on a type of connection between the physical circuit partitions.

8. The method of claim 7, wherein the type of connection between the physical circuit partitions is at least one of a low-voltage differential signaling (LVDS) connection or multi-gigabit transceiver (MGT) connection.

9. The method of claim 1, wherein the first chip, the second chip, and the third chip are each a field programmable gate array (FPGA) chip.

10. The method of claim 1, further comprising determining an updated proportioned slack budget for a third timing path based on a cumulative unused delay from the first timing path and the second timing path.

11. A system comprising:

a memory storing instructions; and a processor coupled with the memory, the processor configured to execute the instructions to cause the processor to:

receive a physical circuit design file that includes physical circuit partitions that are each mapped to at least one of a first chip, a second chip, and a third chip, wherein the first chip and the second chip are connected by a first timing path, the second chip and the third chip are connected by a second timing path, wherein the first timing path and the second timing path each have an original path delay;

determine a proportioned slack budget for each of the first timing path and the second timing path;

determine, for each of the first timing path and the second timing path, a delay upper bound based on the original path delay and the slack budget of each timing path;

update the delay upper bound of each timing path based on a shortest timing path delay;

assign a multiplexing data ratio (XDR) value to the proportioned slack budget for each of the first timing path and the second timing path;

adjust the XDR value based on reuse of existing wires in at least one of the first timing path and second timing path;

determine an updated proportioned slack budget for each of the first timing path and the second timing path, based at least in part on the adjusted XDR value and the desired delay for each of the first timing path and second timing path; and adjust a routing of electronic signals along the first timing path and the second timing path, based on the proportioned slack budget.

12. The system of claim 11, wherein the proportioned slack budget for each of the first timing path and the second timing path is determined based on a proportion of the original delay for each of the first timing path and the second timing path.

13. The system of claim 11, wherein the processor is further configured to execute the instructions to cause the processor to update a delay upper bound of a third timing path based on a cumulative unused delay from the first timing path and the second timing path.

14. The system of claim 11, wherein the XDR is further determined based on a congestion of each of the first timing path and the second timing path.

15. The system of claim 14, wherein the congestion is determined based on a type of wire utilized in each of the first timing path and the second timing path.

16. The system of claim 11, wherein the first chip, the second chip, and the third chip are each a field programmable gate array (FPGA) chip.

17. A non-transitory computer readable medium comprising stored instructions, which when executed by a processor, cause the processor to perform a method, comprising:

receiving a physical circuit design file that includes physical circuit partitions that are each mapped to at least one of a first chip, second chip, and a third chip, wherein the first chip and the second chip are connected by a first timing path, the second chip and the third chip are connected by a second timing path, wherein the first timing path and the second timing path each have a desired delay;

determining a total slack budget based on a driver clock period and a sum of the desired delay for the first timing path and the desired delay for the second timing path;

proportioning the total slack budget to the first timing path and the second timing path based on the desired delay for each of the first timing path and the second timing path; and adjusting a routing of electronic signals along the first timing path and the second timing path, based on the proportional slack budget, including determining, for each of the first timing path and the second timing path, a delay upper bound and selecting a corresponding data-multiplexing value that satisfies the delay upper bound.

18. The method of claim 17, wherein the proportioning the total slack budget to each respective timing path is based at least in part on a congestion value of each respective timing path.

19. The method of claim 17, wherein the desired delay is based on a type of connection between the physical circuit partitions.

20. The method of claim 17, wherein the physical circuit partitions are each mapped to a Field Programmable Gate Array (FPGA) chip.

* * * * *